Feb. 24, 1970 W. T. RUSCH 3,497,829
LINEAR SAWTOOTH GENERATOR
Filed March 18, 1968

INVENTOR
WILLIAM T. RUSCH
BY Richard J. Seligman
ATTORNEY

United States Patent Office 3,497,829

Patented Feb. 24, 1970

3,497,829

LINEAR SAWTOOTH GENERATOR

William T. Rusch, Hollis, N.H., assignor to Sanders Associates Inc., Nashua, N.H., a corporation of Delaware Filed Mar. 18, 1968, Ser. No. 713,862

Int. Cl. H03k *3/282, 4/56, 4/52*

U.S. Cl. 331—113 4 Claims

ABSTRACT OF THE DISCLOSURE

A sawtooth generator is herein disclosed comprising an operational integrator in conjunction with a complementary free-running multivibrator.

A linear sawtooth waveform and positive and negative pulses are obtained using only three transistors.

Background of the invention

In many applications it is necessary to generate sawtooth waveforms having good linearity, rapid flyback time and good output impedance characteristics.

Conventional sawtooth waveform generating circuits often comprise a supply voltage for charging a capacitor and means for discharging the capacitor. Since the capacitor charges exponentially a non-linear sawtooth is produced. However, if the supply voltage is very much greater than the potential to which the capacitor is charged, a more linear waveform is produced because only the nearly linear portion of the exponential capacitor charge curve is utilized. Circuits of this type have the disadvantages that high supply voltages are required, the sawtooth approaches linearity but is not truly linear and the output impedance across the capacitor is high, usually requiring an extra stage for buffering. To gain further linearity the prior art discloses employing a constant current source to charge the capacitor. If a pentode is employed for this purpose, high supply voltage will be required to operate the constant current source even if a relatively low amplitude sawtooth is desired. If a transistor constant current source is employed, the problem of high voltage source is mitigated. However, the output impedance is still high and must be buffered.

It is possible to provide a sawtooth generator comprising an operational integrator in combination with a free-running multivibrator whereby the integrator provides the desiable low output impedance. However, the capcitor discharge path includes the resistance of the integrator resulting in slow flyback time. The flyback time of such a circuit can be improved by providing a very large voltage at the multivibrator, thus a return to the high voltage problem.

Summary of the invention

Accordingly, it is an object of this invention to provide a novel sawtooth generator.

It is another object of this invention to provide a circuit for generating linear sawtooth waveforms having short flyback time.

It is a further object of this invention to provide a linear sawtooth generator having low output impedance.

It is an additional object of this invention to provide a linear-low voltage-low output impedance sawtooth generator.

It is yet another object of this invention to provide a linear sawtooth generator which also generates positive and negative sync pulses.

Briefly, an operational integrator which gives low output impedance and linear sweep is employed in conjunction with a complementary free-running multivibrator. The multivibrator provides a low impedance path to charge the capacitor of the operational integrator during flyback. Additionally, it simultaneously provides sync pulses.

Brief description of the drawings

The above-mentioned and other features and objects of this invention will become more apparent by reference to the following description taken in conjunction with the accompanying drawings, in which.

Description of preferred embodiments

Figure 1:
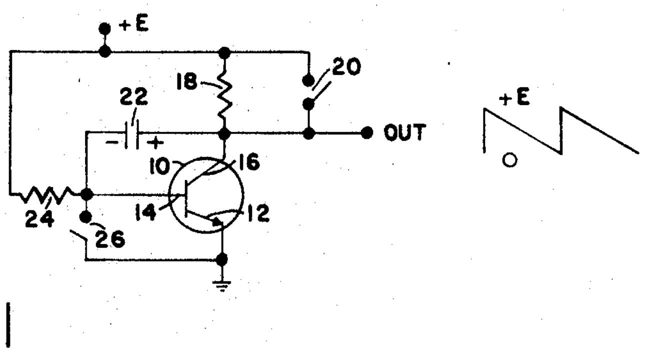
FIG. 1 is a schematic illustration of an embodiment of the invention.

Referring now to FIG. 1, there is illustrated thereby a schematic of a sawtooth generator constructed according to the invention. The sawtooth generator comprises a transistor 10 having emitter 12, base 14 and collector 16 electrodes. The collector 16 is coupled to a voltage source E via a resistor 18; a switch 20 is connected across resistor 18. A capacitor 22 is coupled from base 14 of transistor 10 to collector 16 thereof. Base 14 is coupled to the voltage supply E by way of a resistor 24 and also connected to ground via a switch 26. Emitter 12 of transistor 10 is connected to ground. The sawtooth waveform is derived at the collector 16 of transistor 10. Transistor 10, resistors 18 and 24, and capacitor 22 comprise an operational integrator. An advantage of using an operational integrator to provide sawtooth waveforms is that the effective value for the capacitor is the capacitor value times the gain of the transistor, thus making the capacitor quite large so that the output impedance will be made quite small.

Switches 20 and 26 are closed simultaneously during flyback thereby charging capacitor 22 rapidly to plus E volts bypassing any resistance which might otherwise be in the charge path. The switches are then opened simultaneously leaving a conventional operational integrator. Resistor 24 connected to the plus E supply provides constant input voltage. The integrator integrates this (with a phase reversal) providing linear sweep falling from plus E volts to zero.

Figure 2:
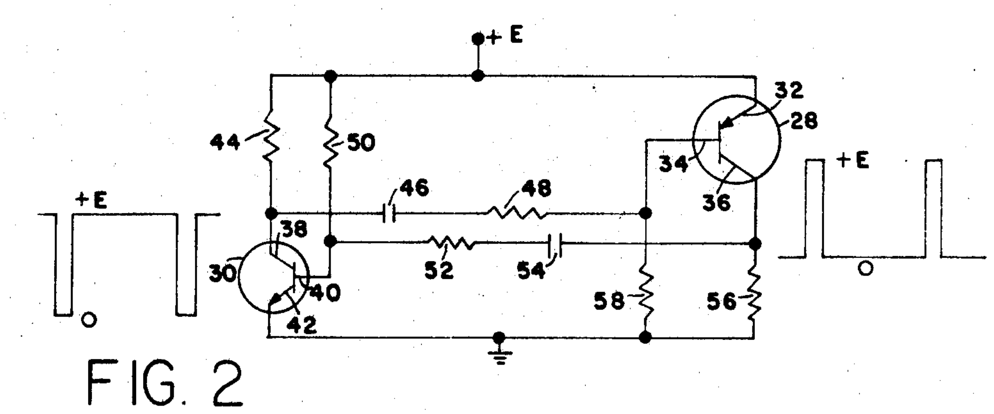
FIG. 2 is a schematic illustration of a complementary free-running multivibrator.

Referring now to FIG. 2, there is illustrated thereby a complementary free-running multivibrator comprising complementary transistors 28 and 30. Tansistor 28, PNP type, has emitter 32, base 34 and collector 36 electrodes and transistor 30, NPN type, has collector 38, base 40 and emitter 42 electrodes. The collector 38 of transistor 30 is coupled to a plus E supply voltage via a register 44 and to the base 34 of transistor 28 via a capacitor 46 and a resistor 48. The base 40 of transistor 30 is coupled to the plus E supply voltage via a resistor 50 and to the collector 36 of transistor 28 via a resistor 52 and a capacitor 54. The emitter 42 of transistor 30 is tied to ground. The collector 36 of transistor 28 is coupled to ground via a resistor 56; and the base 34 of transistor 28 is coupled to ground via a resistor 58. The emitter 32 of transistor 28 is tied to the plus E supply voltage.

This complementary free-running multivibrator differs from conventional multivibrators in that both transistors conduct (or do not conduct) at the same time. The waveform at the collector 38 of transistor 30 is a series of negative pulses and the waveform at the collector 36 of transistor 28 is a series of positive pulses.

It should be noted that, when conducting, transistors 28 and 30 provide ideal low impedance current paths (in the proper direction) to take the place of switches 20 and 26, respectively, of FIG. 1.

Figure 3:
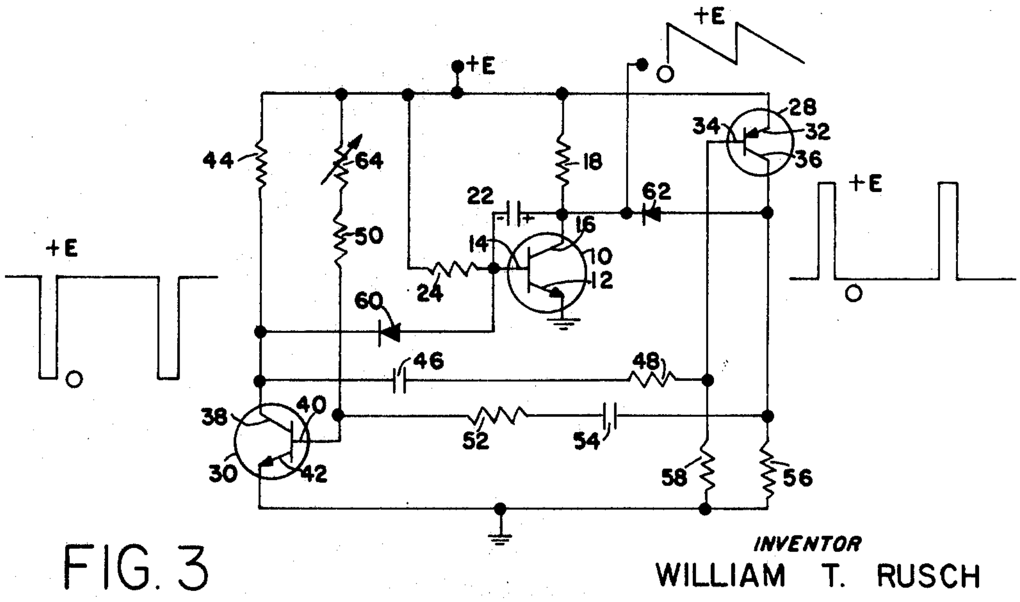
FIG. 3 is a schematic illustration of an embodiment similar to that of FIG. 1 but employing the multivibrator of FIG. 2.

Referring now to FIG. 3, there is illustrated thereby a sawtooth generator similar to that of FIG. 1, however, having the switches 20 and 26 being replaced by the complementary free-running multivibrator of FIG. 2. In the combining of the two circuits a pair of diodes 60 and 62 are employed to provide isolation between the complementary free-running multivibrator and the operational integrator. Transistor 10 should not conduct during flyback. If necessary, one or more diodes may be inserted between its emitter and ground to insure this cutoff condition. An added variable resistor 64 is inserted to provide adjustment of sweep time.

The operation of this circuit is as follows: Transistors 28 and 30 of the free-running complementary multivibrator are both off during sweep and both on during flyback. When on, they charge capacitor 22 to plus E volts through diodes 60 and 62—the right side of capacitor 22 going toward plus E and the left side toward ground. Transistor 10 should be off at this time. If however, the voltage drops across transistor 30 and diode 60 are too high, one or more diodes are added to the emitter circuit of transistor 10 to insure cutoff.

When transistors 30 and 28 go off, the collector 38 of transistor 30 rises rapidly to plus E volts whereas the base of transistor 10 stays near ground, diode 60 being thereby back-biased during sweep. Similarly, with transistor 28 off, the collector 36 thereof goes to ground. The positive voltage at the collector 16 of transistor 10 keeps diode 62 back-biased during sweep.

Thus, the circuit of FIG. 1 is realized in a practical manner. The integrator is totally disconnected from the multivibrator during sweep. Since resistance 24 is connected to the plus E supply, integrator action of resistor 24, capacitor 22, and transistor 10 gives a linear sweep falling from plus E volts to zero.

Features of this circuit are: a linear sweep is achieved and a low output impedance is provided which will not require additional buffering stages. Additional advantages of this circuit are that flyback is achieved without great bandwidth in transistor 10 since capacitor 22 is charged through transistor 28, diodes 62 and 60, and transistor 30. Thus, transistor 10 can be a low frequency high-gain type, the high gain giving linear sweep. The circuit also requires very low current drain from the supply by the multivibrator since the transistors 30 and 28 conduct only during the short flyback time. A further feature of this invention is that sync pulses are derived at the transistors 30 and 28 which could be used in many applications wherein sawtooth sweeps and sync pulses would be required such as cathode ray tube display systems.

A typical set of values for the components of FIG. 3 for two sweep frequencies are as follows:

| | 60 Hz./15,750 Hz. |
|---|---|
| Resistors: | |
| **44** | 2K ohms. |
| **50** | 150K. |
| **48** | 2K. |
| **52** | 2K. |
| **58** | 220K. |
| **56** | 2K. |
| **18** | 2K. |
| **64** | 100K, variable. |
| **24** | 15K/13K. |

| | |
|---|---|
| Capacitors: | |
| **22** | 1.0 $\mu$f./0.0033 $\mu$f. |
| **46** | 0.22 $\mu$f./620 pf. |
| **54** | 0.1 $\mu$f./390 pf. |
| Diodes **60, 62** | 1N270. |
| Transistors: | |
| **10, 30** | 2N5133. |
| **28** | 2N5139. |

Of course, these values are exemplary only and are those used in reduction to practice of this invention for the specific frequencies set forth. Other variations will be obvious to those skilled in the art.

While I have described the principles of my invention in connection with specific apparatus, it is to be clearly understood that this description is made only by way of example and not as a limitation on the scope of my invention as set forth in the appended claims.

I claim:

1. A linear sawtooth generator, comprising:
- a voltage source;
- an operational integrator coupled to said voltage source; and
- a complementary free-running multivibrator having first and second outputs, said first output being coupled to one side of the capacitor of said operational integrator with said second output coupled to the other side of said capacitor.

2. A linear sawtooth generator as defined in claim 1, further including first and second diodes, said first diode coupling said first output of said multivibrator to said one side of said capacitor with said second diode coupling said second output of said multivibrator to said other side of said capacitor

3. A linear sawtooth generator, comprising:
- a transistor having first, second and third electrodes, said third electrode being coupled to ground;
- a voltage source;
- a first resistor coupled from said first electrode of said transistor to said voltage source;
- a second resistor coupled from said second electrode of said transistor to said voltage source;
- a capacitor coupled from said first electrode of said transistor to said second electrode of said transistor; and
- a complementary free-running multivibrator having first and second outputs, said first output being coupled to one side of said capacitor with said second output coupled to the other side of said capacitor.

4. A linear sawtooth generator defined in claim 3, further including first and second diodes, said first diode coupling said first output of said multivibrator to said one side of said capacitor with said second diode coupling said second output of said multivibrator to said other side of said capacitor.

References Cited

UNITED STATES PATENTS

| | | | |
|---|---|---|---|
| 3,131,362 | 4/1964 | Dersch | 331—108 |
| 3,315,101 | 4/1967 | Smith | 328—128 |

JOHN KOMINSKI, Primary Examiner

U.S. Cl. X.R.

328—128